(12) United States Patent
Chen et al.

(10) Patent No.: US 12,256,647 B2
(45) Date of Patent: *Mar. 18, 2025

(54) EMBEDDED MRAM FABRICATION PROCESS FOR ION BEAM ETCHING WITH PROTECTION BY TOP ELECTRODE SPACER

(71) Applicant: Taiwan Semiconductor Manufacturing Co., Ltd., Hsinchu (TW)

(72) Inventors: Jun-Yao Chen, Hsinchu (TW); Harry-Hak-Lay Chuang, Hsinchu (TW); Hung Cho Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/311,191

(22) Filed: May 2, 2023

(65) Prior Publication Data
US 2023/0270018 A1    Aug. 24, 2023

Related U.S. Application Data

(63) Continuation of application No. 17/342,464, filed on Jun. 8, 2021, now Pat. No. 11,659,775, which is a
(Continued)

(51) Int. Cl.
*H10N 50/00* (2023.01)
*H10N 50/01* (2023.01)
(Continued)

(52) U.S. Cl.
CPC ............ *H10N 50/80* (2023.02); *H10N 50/01* (2023.02); *H10N 50/85* (2023.02)

(58) Field of Classification Search
CPC .......... H01L 29/0649; H01L 21/26513; H01L 29/66545; H01L 29/1083; H01L 21/324; H01L 27/1207; H01L 29/7816; H01L 29/7835; H01L 21/823807; H01L 29/0653; H01L 29/66659; H01L 21/84; H01L 29/0638; H01L 21/02164; H01L 21/02255; H01L 21/308; H01L 21/31051; H01L 21/32139; H01L 21/823821; H01L 21/845; H01L 23/5286; H01L 27/092;
(Continued)

(56) References Cited

U.S. PATENT DOCUMENTS 9,564,577 B1   2/2017  Hsu et al.
9,847,481 B2 * 12/2017  Chang .................. H10N 70/063
(Continued)

*Primary Examiner* — Thong Q Le
(74) *Attorney, Agent, or Firm* — Seed IP Law Group

(57) ABSTRACT

An integrated circuit die includes a magnetic tunnel junction as a storage element of a MRAM cell. The integrated circuit die includes a top electrode positioned on the magnetic tunnel junction. The integrated circuit die includes a first sidewall spacer laterally surrounding the top electrode. The first sidewall spacer acts as a mask for patterning the magnetic tunnel junction. The integrated circuit die includes a second sidewalls spacer positioned on a lateral surface of the magnetic tunnel junction.

20 Claims, 11 Drawing Sheets

Related U.S. Application Data continuation of application No. 16/672,110, filed on Nov. 1, 2019, now Pat. No. 11,063,208.

(60) Provisional application No. 62/868,637, filed on Jun. 28, 2019.

(51) Int. Cl.
  *H10N 50/80* (2023.01)
  *H10N 50/85* (2023.01)

(58) Field of Classification Search
  CPC ... H01L 29/1095; H01L 29/16; H01L 29/161; H01L 29/402; H01L 29/4238; H01L 29/66689; H01L 29/66795; H01L 29/66803; H01L 29/7833; H01L 29/7838; H01L 29/7848; H01L 29/785; H01L 29/7851; H01L 27/1203; H01L 29/42364; H01L 29/665; H01L 29/6653; H01L 29/78603; H01L 21/2253; H01L 21/28518; H01L 21/74; H01L 21/76202; H01L 27/088; H01L 29/408; H01L 29/42376; H01L 29/4983; H01L 29/66492; H01L 29/66681; H01L 29/78; H01L 29/7883; H01L 21/3086; H01L 21/31111; H01L 21/76224; H01L 21/76283; H01L 21/823412
  See application file for complete search history.

(56) References Cited

U.S. PATENT DOCUMENTS

| | | |
|---|---|---|
| 11,264,559 B2 | 3/2022 | Worledge et al. |
| 11,659,775 B2 * | 5/2023 | Chen ..................... H10N 50/10 365/158 |
| 2016/0225979 A1 | 8/2016 | Hsu et al. |
| 2020/0365795 A1 | 11/2020 | Chuang et al. |

* cited by examiner

EMBEDDED MRAM FABRICATION PROCESS FOR ION BEAM ETCHING WITH PROTECTION BY TOP ELECTRODE SPACER

BACKGROUND

Technical Field

The present disclosure relates to the field of integrated circuits. The present disclosure relates more particularly to integrated circuits including magnetoresistive random access memory (MRAM) cells.

Description of the Related Art

MRAM cells include magnetic data storage elements. Typically, an MRAM cell includes a magnetic tunnel junction as a data storage device. The magnetic tunnel junction includes first and second magnetic plates separated by a thin barrier layer. The first magnetic plate is a permanent magnet having a selected magnetization. The second magnetic plate has a magnetization that can be selectively changed by passing an electrical current adjacent to the second magnetic plate. The electrical resistance between the two magnetic plates is based, in part, on the alignment of the magnetizations of the first and second plates. Accordingly, data is written to the MRAM cell by adjusting the magnetization of the second plate. Data is read from the MRAM cell by measuring the resistance between the first and second plates.

MRAM cells have many advantages over traditional random-access memory cells. MRAM cells require far less surface area and power consumption than SRAM cells, while maintaining access speeds comparable to SRAM cells. MRAM cells are much faster than DRAM cells while consuming far less power. Unlike SRAM and DRAM cells, MRAM cells are nonvolatile and can retain data when power is disconnected. Unlike SRAM and DRAM cells, MRAM cells are not susceptible to data corruption from radiation events.

In spite of these many advantages, traditional techniques for fabricating MRAM cells suffer from some drawbacks. MRAM cells include a top electrode positioned on a top plate of the magnetic tunnel junction. Using traditional fabrication techniques, when patterning the top electrode, it is possible that material etched from the top electrode will redeposit on a lateral surface of the magnetic tunnel junction. This redeposition of material from the top electrode can result in a short-circuit between the first and second magnetic plates of the magnetic tunnel junction. If a short-circuit exists between the first and second magnetic plates of the magnetic tunnel junction, the memory cell will not function properly.

DETAILED DESCRIPTION

Figure 1:
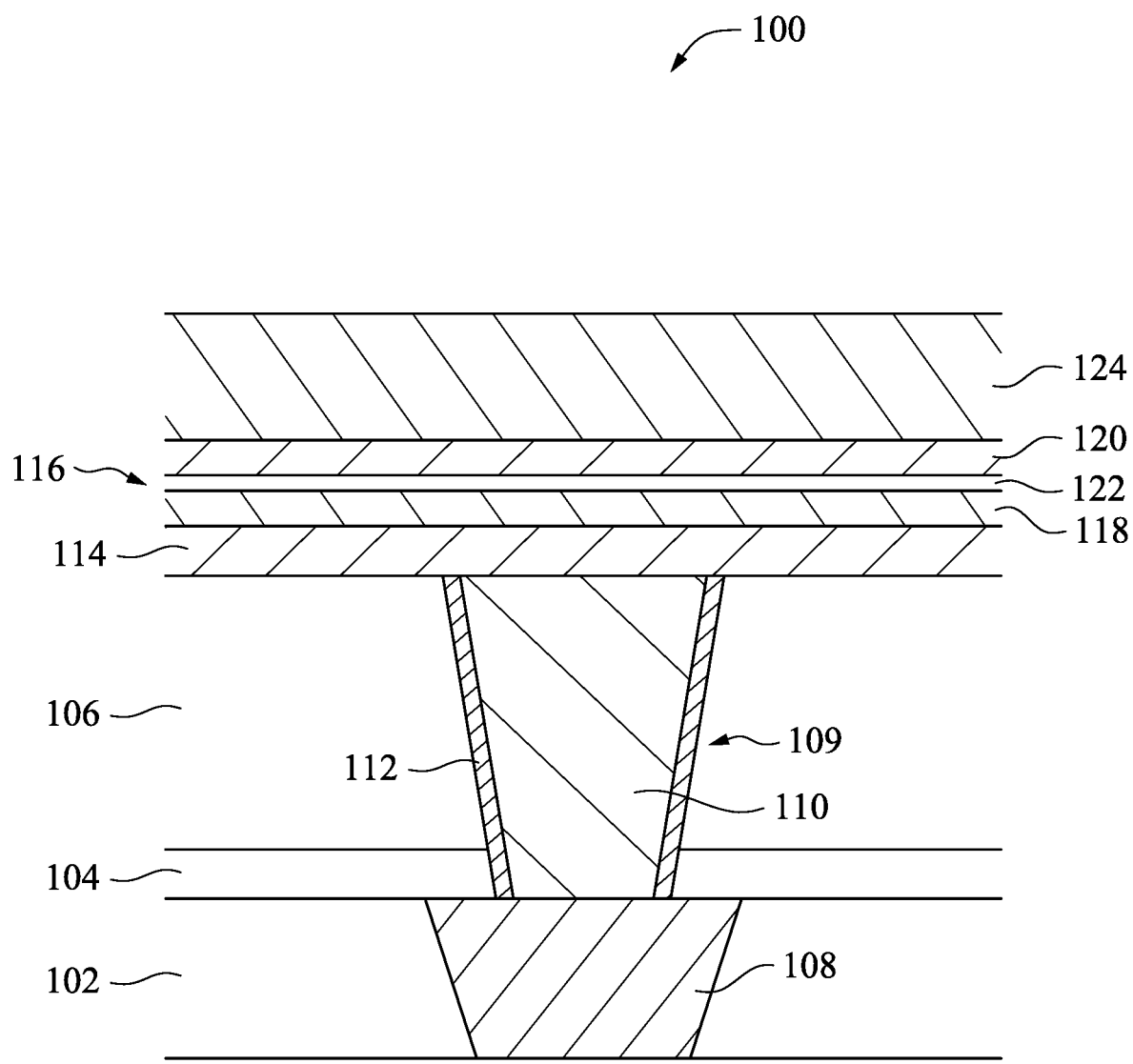
FIGS. 1-9 illustrate cross-sectional views of an integrated circuit die at successive stages of fabrication, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

In one embodiment, an integrated circuit die includes an MRAM cell. The MRAM cell has a magnetic tunnel junction including a bottom magnetic plate, a top magnetic plate, and a barrier layer separating the bottom plate and the top plate. A top electrode is positioned on the top magnetic plate. A first sidewall spacer is also positioned on the top magnetic plate and laterally surrounds the top electrode. A second sidewall spacer laterally surrounds the magnetic tunnel junction and is in contact with a sidewall of the magnetic tunnel junction and the first sidewall spacer. The presence of the first sidewall spacer ensures that when the magnetic tunnel junction is patterned, material from the top electrode does not redeposit on the sidewalls of the magnetic tunnel junction.

One embodiment is a method for forming an MRAM cell in an integrated circuit die. The method includes depositing magnetic tunnel junction layers and depositing a top electrode layer on the magnetic tunnel junction layers. The method includes forming a top electrode from the top electrode layer using photolithography techniques. The method includes forming a first sidewall spacer on top of the magnetic tunnel junction layers and on sidewalls of the top electrode. The method includes forming a magnetic tunnel junction by etching the magnetic tunnel junction layers using the first sidewall spacer as a hard mask. Because the magnetic tunnel junction layers are patterned while the first sidewall spacer surrounds the top electrode, no material from the top electrode is redeposited on the sidewalls of the magnetic tunnel junction.

FIG. 1 is a cross-sectional view of a portion of an integrated circuit die 100, according to one embodiment. The integrated circuit die 100 is at an intermediate stage of fabrication. When fabrication of the integrated circuit die 100 is complete, the integrated circuit die 100 will include an array of MRAM cells.

The integrated circuit die 100 includes a layer of dielectric material 102. The layer of dielectric material 102 can include a low-k dielectric material. In accordance with some embodiments of the present disclosure, the thickness of the layer of dielectric material 102 is about 1000 Å.

Low-k dielectric materials help reduce the capacitance between metal lines and metal interconnections. As the dimensions of features in integrated circuits continue to shrink, metal lines and metal interconnections scale closer together. The reduction in distance between adjacent metal lines results in increased capacitance between the metal lines. Capacitance also increases with the dielectric constant of a dielectric material that separates the metal lines. If the capacitance between two adjacent metal lines becomes too high, it is possible that crosstalk will occur between the adjacent metal lines. This crosstalk can result in faulty data reads, faulty computing operations, and faulty signal outputs.

In order to reduce or prevent crosstalk between metal lines, the layer of dielectric material 102 is a low-k dielectric. A low-k dielectric material typically refers to a material that has a dielectric constant that is lower than the dielectric constant of common $SiO_2$. $SiO_2$ has a relative dielectric constant of 3.9. Accordingly, the layer of dielectric material 102 can include a dielectric material with a dielectric constant less than 3.9.

In one embodiment, the layer of dielectric material 102 includes a porous $SiO_2$. The porous $SiO_2$ includes pores. The pores are typically filled with air. Air has as a relative dielectric constant of about 1. The resulting total relative dielectric constant of the porous $SiO_2$ is about 2.0. Those of skill in the art will recognize, in light of the present disclosure, that the layer of dielectric material 102 can include a low-k dielectric other than porous $SiO_2$, without departing from the scope of the present disclosure.

The integrated circuit die 100 includes a layer of dielectric material 104 positioned on the layer of dielectric material 102. The layer of dielectric material 104 can include SiC. Other suitable materials can be used for the layer of dielectric material 104 without departing from the scope of the present disclosure. In accordance with some embodiments of the present disclosure, the thickness of the layer of dielectric material 104 is between 200 Å and 300 Å, though other thicknesses can be used without departing from the scope of the present disclosure.

The integrated circuit die 100 includes a layer of dielectric material 106 positioned on the layer of dielectric material 104. The layer of dielectric material 106 can include an intermetal dielectric having a thickness between 400 Å and 600 Å. The intermetal dielectric layer 106 can include $SiO_2$, such as a TEOS formed $SiO_2$. Alternatively, the intermetal dielectric layer 106 can include SrO. Other suitable materials and thicknesses can be used for the intermetal dielectric layer 106 without departing from the scope of the present disclosure.

A bottom electrode layer 114 is positioned on the layer of dielectric material 106. The bottom electrode layer 114 is a conductive material. The bottom electrode layer 114 has a thickness 150 Å and 250 Å. The bottom electrode layer 114 can include TaN or TiN. Other suitable materials and thicknesses can be used for the bottom electrode layer 114 without departing from the scope of the present disclosure. The purpose of the bottom electrode layer 114 will be described in more detail below.

In one embodiment, a metal line 108 is positioned in the layer of dielectric material 102. The metal line 108 can include Cu, AlCu, Al or other conductive materials suitable for a metal line. As will be described in more detail below, the metal line 108 can assist in reading data from or writing data to an MRAM cell.

While a single metal line 108 is shown in FIG. 1, in practice, a large number of metal lines can be positioned in the layer of dielectric material 102. The metal lines can include metal interconnects, bitlines, wordlines, or other metal connections for passing signals in the integrated circuit die 100. As described previously, the low-k dielectric material selected for the layer of dielectric material 102 can help reduce parasitic capacitance between the metal lines.

A via 109 is formed in the layers of dielectric material 104 and 106. The via 109 extends from the bottom electrode layer 114 to the metal line 108. The via 109 enables an electrical connection between the bottom electrode layer 114 and the metal line 108.

A plug 110 is formed in the via 109. The plug 110 includes a conductive material. The plug 110 electrically connects the metal line 108 to the bottom electrode layer 114. The plug 110 can include TiN or other suitable materials.

In one embodiment, the integrated circuit die 100 includes a magnetic tunnel junction layer 116 positioned on the bottom electrode layer 114. The magnetic tunnel junction layer 116 includes a reference magnetic plate layer 118, a free magnetic plate layer 120, and a barrier layer 122 positioned between the reference magnetic plate layer 118 and the free magnetic plate layer 120. As will be described in more detail below, the magnetic tunnel junction structure of an MRAM cell will be formed from the magnetic tunnel junction layer 116. In accordance with some embodiments of the present disclosure, the magnetic tunnel junction layer 116 is between 250 Å and 350 Å thick, though other thicknesses can be used without departing from the scope of the present disclosure.

In one embodiment, the reference magnetic plate layer 118 acts as a permanent magnet. The reference magnetic plate layer 118 includes a fixed magnetization. The free magnetic plate layer 120 includes a material having a magnetization that can be selectively changed. When the magnetization of the free magnetic plate layer 120 aligns with the magnetization of the reference magnetic plate layer 118, there is a relatively low electrical resistance between the reference magnetic plate layer 118 and the free magnetic plate layer 120. When the magnetization of the reference magnetic plate layer 120 does not align with the magnetization of the reference magnetic plate layer 118, there is a relatively high electrical resistance between the reference magnetic plate layer 118 and the free magnetic plate layer 120. As will be discussed in further detail below, this effect is utilized to write data to MRAM cells formed from the magnetic tunnel junction layer 116.

While the reference magnetic plate layer 118 is shown as a single layer in FIG. 1, in practice, the reference magnetic plate layer 118 can have a plurality of layers. For example, the reference magnetic plate layer 118 can include a plurality of ferromagnetic layers separated from each other by nonmagnetic layers. The ferromagnetic layers can include at least one of Fe, Co, or Ni. The nonmagnetic layers can include one or more of Cr, Pd, Ir, Ru, Rh, Os, Re, Au, or Cu. The alternating ferromagnetic and nonmagnetic layers collectively form a reference magnetic plate layer 118 with a fixed magnetization. In accordance with some embodiments of the present disclosure, the total thickness of the reference magnetic plate layer 118 can is between 100 Å and 150 Å. Other suitable materials and thicknesses can be used for the reference magnetic plate layer 118 without departing from the scope of the present disclosure.

While the free magnetic plate layer 120 is shown as a single layer in FIG. 1, in practice, the free magnetic plate layer 120 can have a plurality of layers. The free magnetic plate layer 120 can include one or more layers of CoHf, Co, CoFeB, or CoZr. The material or materials of the free magnetic plate layer 120 are selected to enable the free magnetic plate layer 120 to be selectively magnetized to align with the magnetization of the reference magnetic plate layer 118 or to align with the reference magnetic plate layer 118. In accordance with some embodiments of the present disclosure, the total thickness of the free magnetic plate layer 120 is between 100 Å and 150 Å. Other suitable materials and thicknesses can be used for the free magnetic plate layer 120 without departing from the scope of the present disclosure.

The barrier layer can include a dielectric material. The barrier layer 122 can include MgO. Alternatively, the barrier layer 122 can include one or more of $TiO_2$, $Al_2O_3$, TiN, or NV. The barrier layer 122 can include multiple layers. In accordance with some embodiments of the present disclosure, the collective thickness of the barrier layer 122 is between 3 Å and 10 Å. Other suitable materials and thicknesses can be used for the barrier layer 122 without departing from the scope of the present disclosure.

A top electrode layer 124 is positioned on the free magnetic plate layer 120. The top electrode layer 124 includes a conductive material. The top electrode layer 124 can include Ta, W, or other suitable conductive materials. In accordance with some embodiments of the present disclosure, the top electrode layer 124 is between 450 Å and 550 Å thick. Other suitable materials and thicknesses can be used for the top electrode layer 124 without departing from the scope of the present disclosure. As is described in more detail below, the top electrode for an MRAM cell will be formed from the top electrode layer 124.

Figure 2:
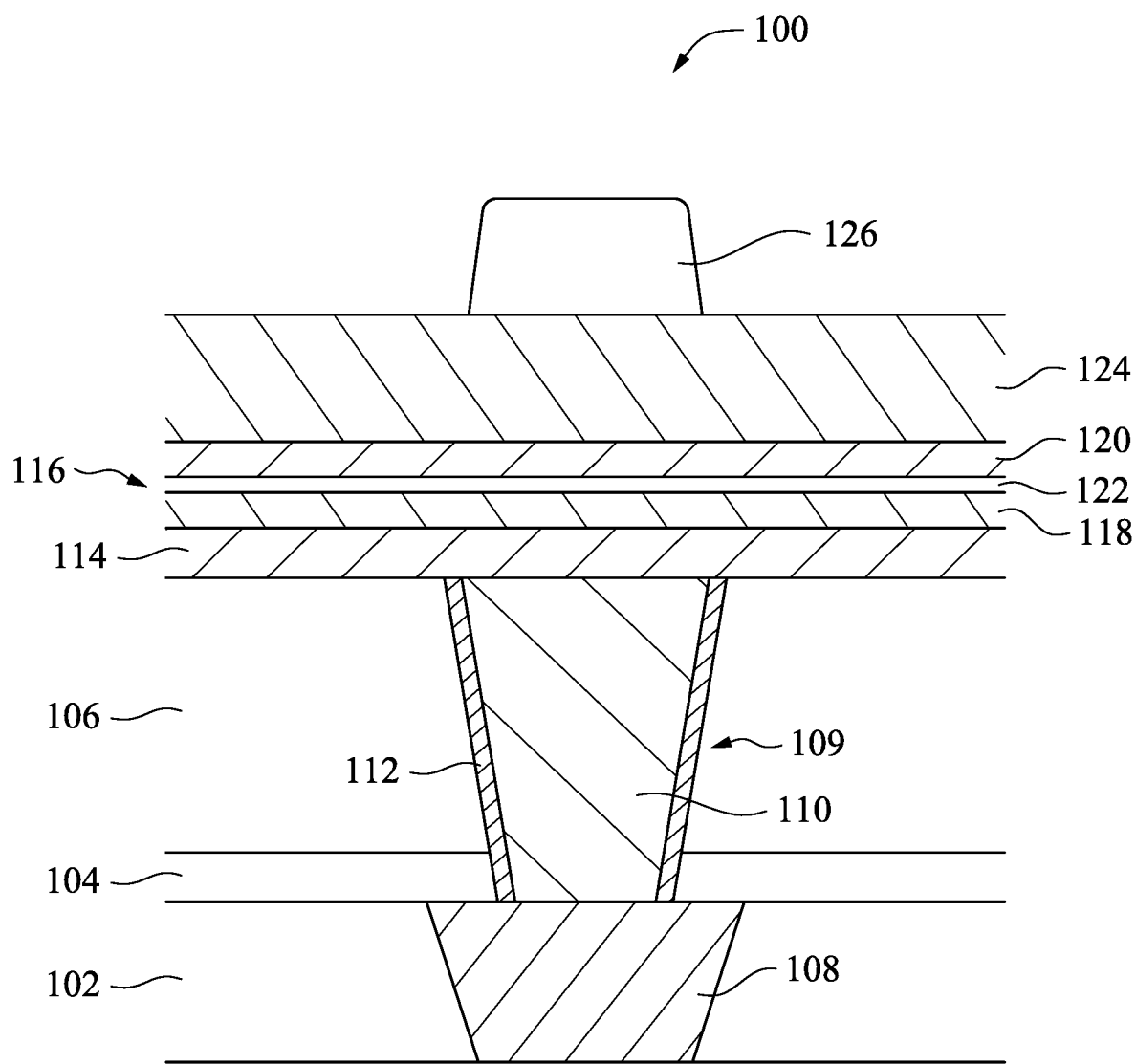

FIG. 2 is a cross-section of the integrated circuit die 100 at an intermediate stage of processing, according to one embodiment. In FIG. 2, a hard mask 126 is formed on top of the top electrode layer 124. The hard mask 126 can be formed using common photolithography techniques including depositing a layer of photoresist, exposing the photoresist to light in the presence of a photolithography mask, and removing non-hardened portions of the photoresist. Other suitable processes and materials can be used to form the hard mask 126 without departing from the scope of the present disclosure. After this process, the hard mask 126 remains on the top electrode layer 124.

Figure 3:
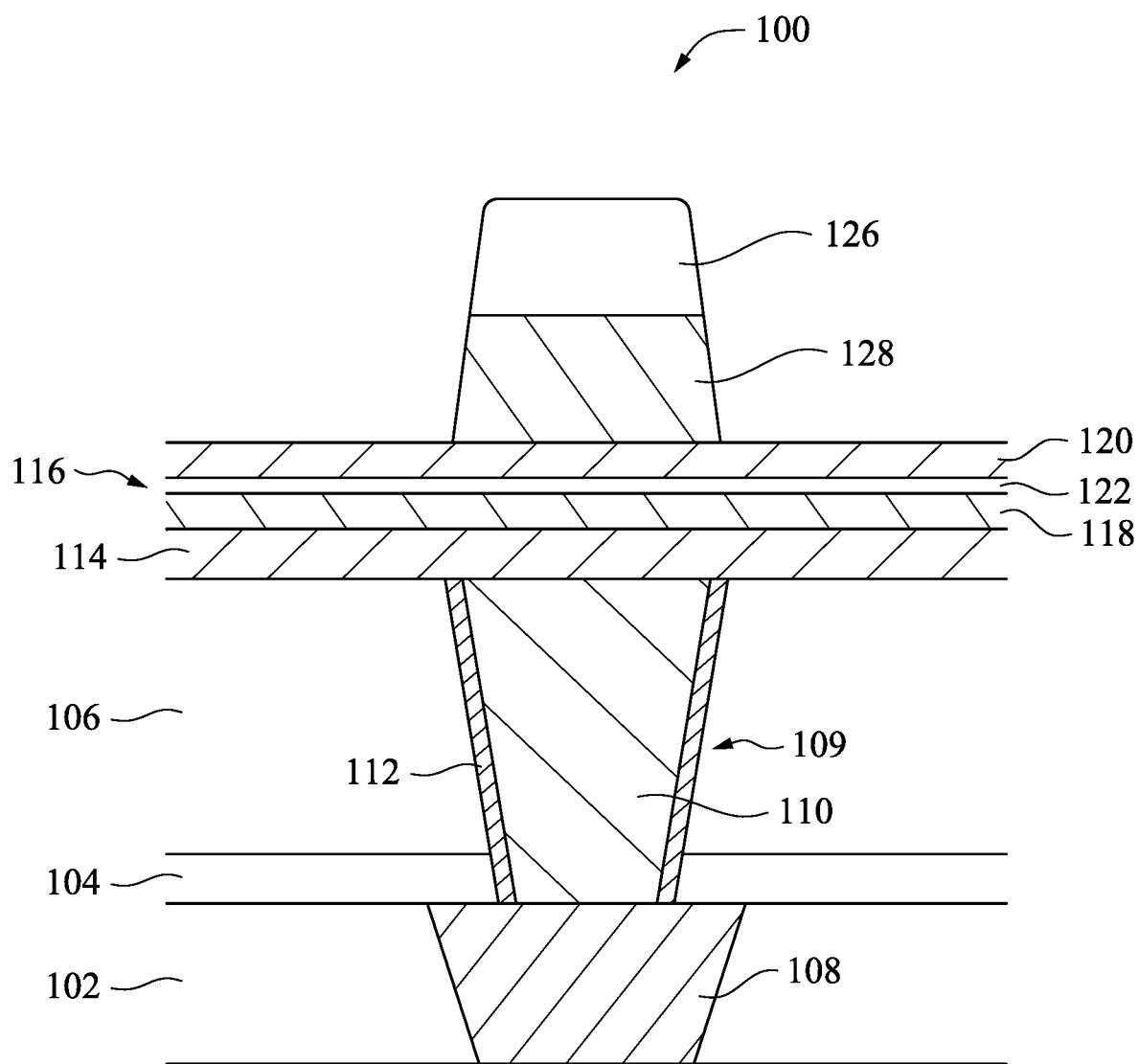

FIG. 3 is a cross-section of the integrated circuit die 100 at an intermediate stage of processing, according to one embodiment. In FIG. 3, a top electrode 128 is formed from the top electrode layer 124. The top electrode 128 is formed by etching the top electrode layer 124 in the presence of the hard mask 126. The etching process removes the top electrode layer 124 everywhere except directly below the hard mask 126.

In one embodiment, the top electrode 128 is formed by using an anisotropic etching process. The anisotropic etching process selectively etches in the downward direction. The result is that the top electrode layer 124 is not significantly etched below the hard mask 126.

In one embodiment, the etching process for forming the top electrode 128 selectively etches the top electrode layer 124 with respect to the free magnetic plate layer 120. In other words, the etching process etches the material of the top electrode layer 124 at a significantly higher rate than the material of the free magnetic plate layer 120. This ensures that the top electrode layer 124 can be etched without substantially etching the free magnetic plate layer 120. The etching process can include a wet etch or dry etch. Accordingly, the chemistry of the etchant is selected to selectively etch the material of the top electrode layer 124 with respect to the free magnetic plate layer 120.

Figure 4:
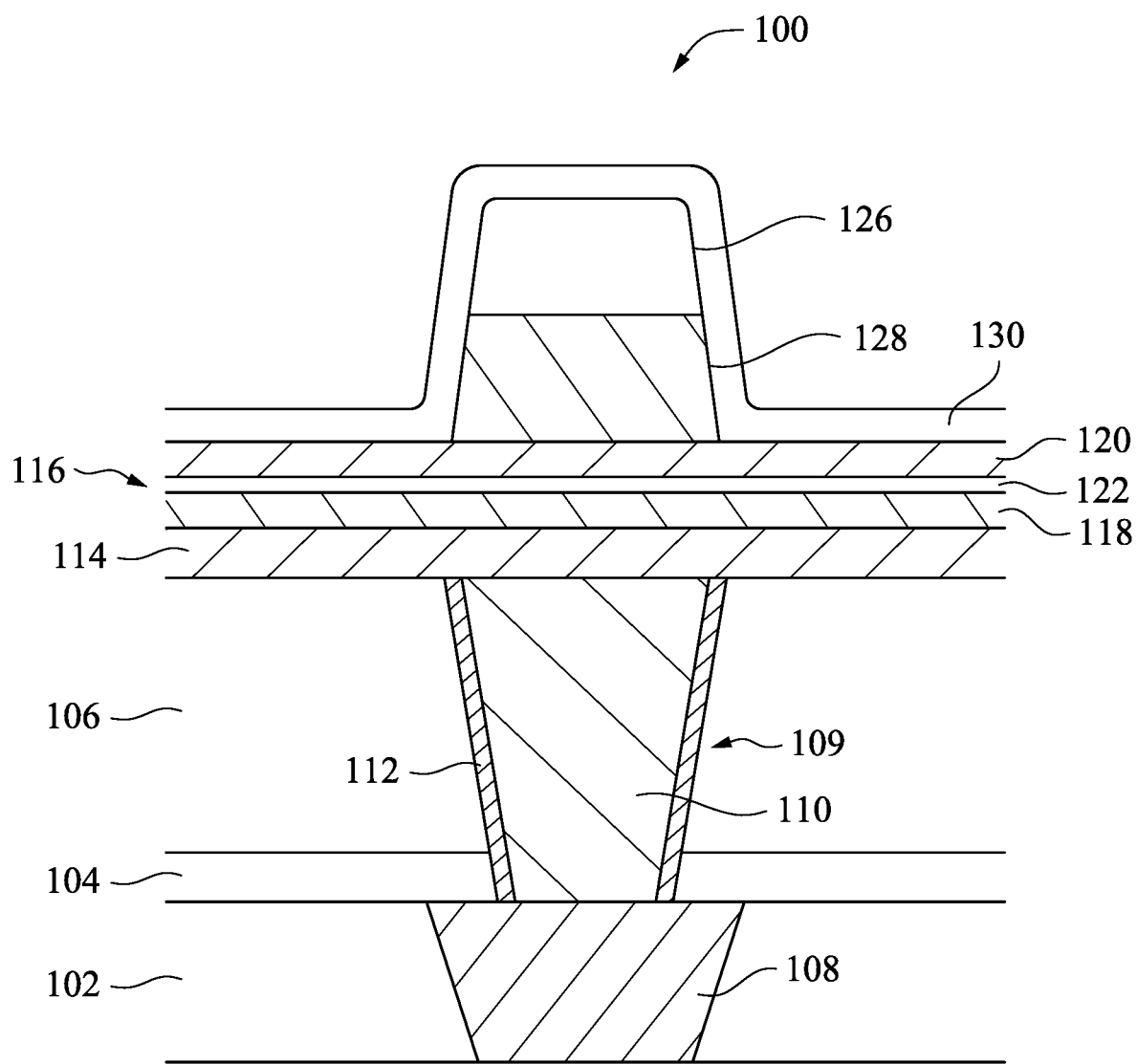

FIG. 4 is a cross-section of the integrated circuit die 100 at an intermediate stage of processing, according to one embodiment. In FIG. 4, a first sidewall layer 130 is deposited on the free magnetic plate layer 120, on sidewalls of the top electrode 128, and on the hard mask 126. As will be set forth in more detail below, a first sidewall spacer will be formed from the first sidewall layer 130.

In one embodiment, the first sidewall layer 130 is SiN. Alternatively, the first sidewall layer 130 can include TiN or Al2O. In accordance with some embodiments of the present disclosure, the first sidewall layer 130 is between 100 Å and 200 Å thick. Other suitable materials and thicknesses can be used for the first sidewall layer 130 without departing from the scope of the present disclosure. The first sidewall layer 130 can be deposited by chemical vapor deposition. Alternatively, the first sidewall layer 130 can be deposited by physical vapor deposition or atomic layer deposition.

Figure 5:
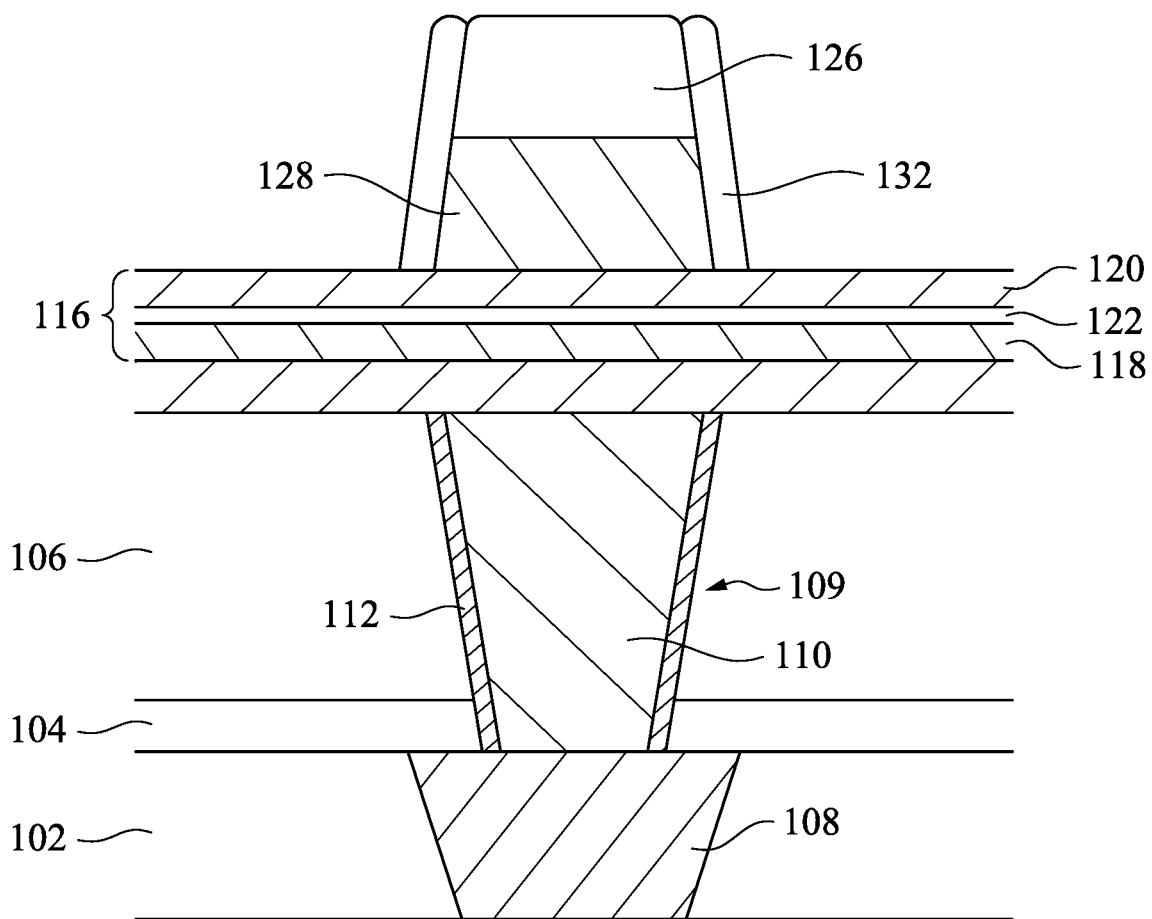

FIG. 5 is a cross-section of the integrated circuit die 100 at an intermediate stage of processing, according to one embodiment. In FIG. 5, a first sidewall spacer 132 is formed from the first sidewall layer 130. The first sidewall spacer 132 is formed by etching the first sidewall layer 130. The etching process removes the first sidewall layer 130 everywhere except on the sidewalls of the top electrode 128 and on the sidewalls of the hard mask 126.

In one embodiment, the first sidewall spacer 132 is formed by using an anisotropic etching process. The anisotropic etching process selectively etches in the downward direction. The result is that the first sidewall layer 130 is completely removed from horizontal surfaces where its thickness is smaller. The first sidewall layer 130 is not completely removed from the sidewalls of the top electrode 128 because the vertical thickness of the first sidewall layer 130 is much thicker at that location.

The etching process can include a timed etch. The etchant will etch vertically at a particular rate. The duration of the etch is selected so that the first sidewall layer 130 is completely removed from the horizontal surfaces where its thickness is between 100 Å and 200 Å. The duration of the etch is selected so that the first sidewall layer 130 is not completely removed from the sidewalls of the top electrode 128 and the hard mask 126 where the vertical thickness is much greater.

In one embodiment, the etching process for forming the first sidewall spacer 132 selectively etches the first sidewall layer 130 with respect to the free magnetic plate layer 120. In other words, the etching process etches the material of the first sidewall layer 130 at a significantly higher rate than the material of the free magnetic plate layer 120. This ensures that the first sidewall layer 130 can be etched without substantially etching the free magnetic plate layer 120. The etching process can include a wet etch or dry etch. Accordingly, the chemistry of the etchant is selected to selectively etch the material of the first sidewall layer 130 with respect to the free magnetic plate layer 120.

After the etch has been performed, the first sidewall spacer 132 remains on the sidewalls of the top electrode 128. As will be described in more detail below, the first sidewall spacer 132 can greatly assist in preventing the formation of faulty magnetic tunnel junctions in MRAM cells.

Figure 6:
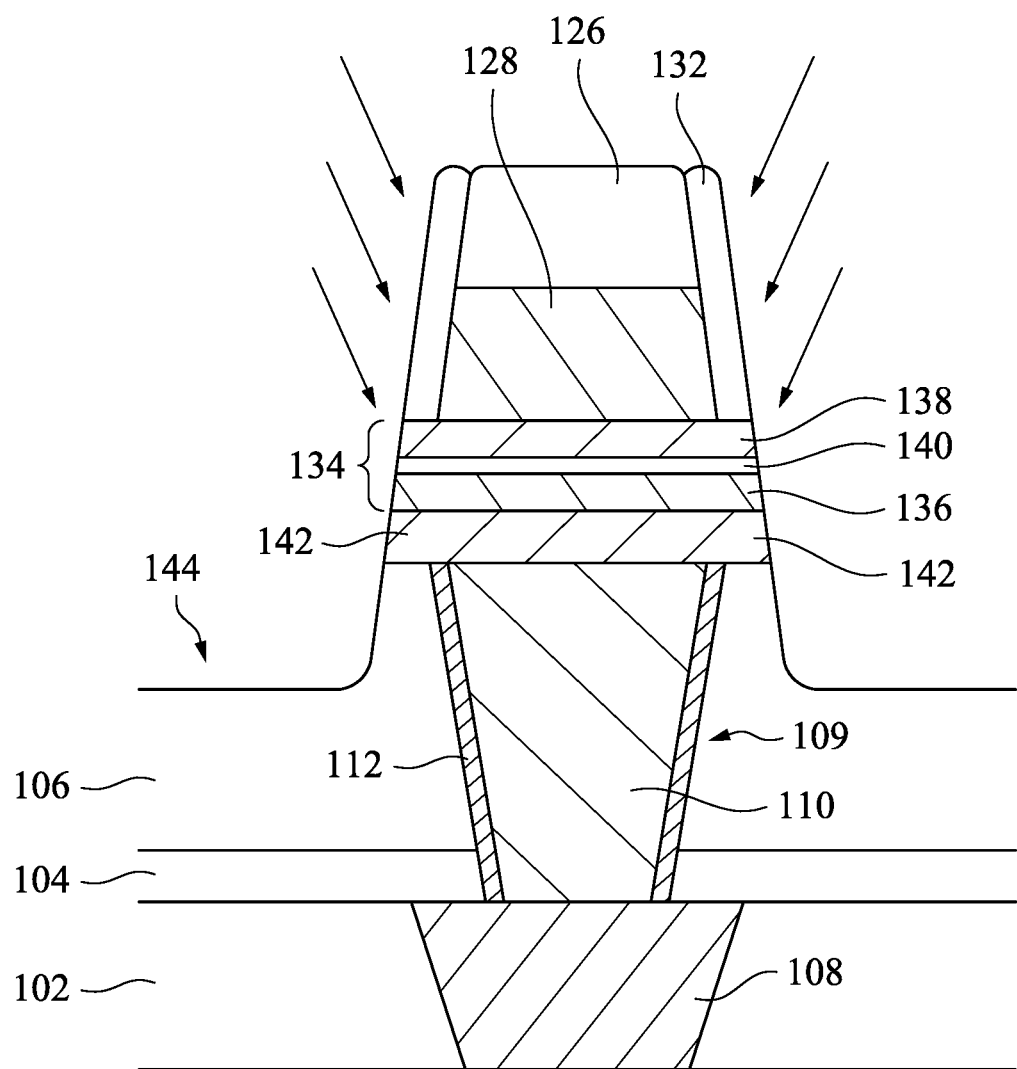

FIG. 6 is a cross-section of the integrated circuit die 100 at an intermediate stage of processing, according to an embodiment. In FIG. 6, an ion beam etching process is performed. The ion beam etching process patterns a magnetic tunnel junction 134 and a bottom electrode 142.

The ion beam etching process includes bombarding the integrated circuit 100 with high-energy ions. In one embodiment, the ions bombard the integrated circuit die 100 at an angle between 20° and 50°. Alternatively, the ions can impact the integrated circuit die with a substantially downward trajectory.

The ion beam etching process etches the magnetic tunnel junction layer 116 and the bottom electrode layer 114. The ion beam etching process is highly effective in etching the magnetic tunnel junction layer 116 and the bottom electrode layer 114. The ion beam etching process also etches a recess 144 in the dielectric layer 106.

The first sidewall spacer 132 acts as a mask for patterning the magnetic tunnel junction 134 and the bottom electrode 142 during the ion beam etching process. The first sidewall spacer 132 is resistant to the ion beam etching process and is not significantly etched by the ion beam etching process. The first sidewall spacer 132 protects the top electrode 128 from being etched by the ion beam etching process. The first sidewall spacer 132 and the top electrode 128 prevent etching of those portions of the magnetic tunnel junction layer 116 and the bottom electrode layer 114 that are directory below the first sidewall spacer 132 and the top electrode 128. Accordingly, after the ion beam etching process is complete the magnetic tunnel junction 134 and the bottom electrode 142 remain, as shown in FIG. 6.

The magnetic tunnel junction 134 includes a reference magnetic plate 136, a free magnetic plate 138, and a barrier 140 between the free magnetic plate 138 and the reference magnetic plate 136. The reference magnetic plate 136 corresponds to the remaining portion of the reference magnetic plate layer 118 after the ion beam etch. The free magnetic plate 138 corresponds to the remaining portion of the free magnetic plate layer 120 after the ion beam etch. The barrier 140 corresponds to the remaining portion of the barrier layer 122 after the ion beam etch. The bottom electrode 142 corresponds to the remaining portion of the bottom electrode layer 114 after the ion beam etch.

In one embodiment, the position of the first sidewall spacer 132 is highly beneficial to the function of the magnetic tunnel junction 134. In particular, because the first sidewall spacer 132 laterally surrounds the top electrode 128, during the ion beam etching process the top electrode 128 is not etched. The result is that material from the top electrode 128 is not ejected during the ion beam etching process. Because no material is ejected from the top electrode 128 during the ion beam etching process, no material from the top electrode 120 is redeposited on sidewalls of the magnetic tunnel junction 134. Thus, there is no risk of short-circuits due to redeposition of conductive material from the top electrode 128 on sidewalls of the magnetic tunnel junction 134.

The magnetic tunnel junction 134 is the storage element of an MRAM cell. The reference magnetic plate 136 is a permanent magnet with a fixed magnetization. The free magnetic plate 138 is a ferromagnet having a magnetization that can be selectively adjusted. The value of data stored in a magnetic tunnel junction is based on whether the magnetization of the free magnetic plate 138 aligns with the magnetization of the reference magnetic plate 136.

Data can be written to the magnetic tunnel junction by passing a current through a conductor adjacent to the free magnetic plate 138. The direction of the current is selected to cause the magnetization in the free magnetic plate 138 to align or misalign with the magnetization of the reference magnetic plate 136.

Data can be read from the magnetic tunnel junction 134 by applying a voltage between the top electrode 128 and the bottom electrode 142. A value of a current flowing between the top electrode 128 and the bottom electrode 142 through the magnetic tunnel junction 134 is based on the resistance between the free magnetic plate 138 and the reference magnetic plate 136. The resistance is higher if the magnetization of the free magnetic plate 138 does not align with the magnetization of the reference magnetic plate 136. The resistance is lower if the magnetization of the free magnetic plate 138 aligns with the magnetization of the reference magnetic plate 136. Accordingly, data can be read from the magnetic tunnel junction 134 by measuring the current, resistance, or voltage drop across the magnetic tunnel junction 134.

Signals are passed to or from the bottom electrode 142 via the metal line 108 and the plug 110. As will be set forth in more detail below, signals can be passed to or from the top electrode 128 via metal lines and plugs whose formation will be described in more detail below.

Though not shown in the Figures, the integrated circuit die 100 can include a semiconductor substrate below the layers and structure shown in the Figures. Transistors can be formed in/on the semiconductor substrate. These transistors can include access transistors for writing data to and reading data from MRAM cells included in the integrated circuit die 100.

Figure 7:
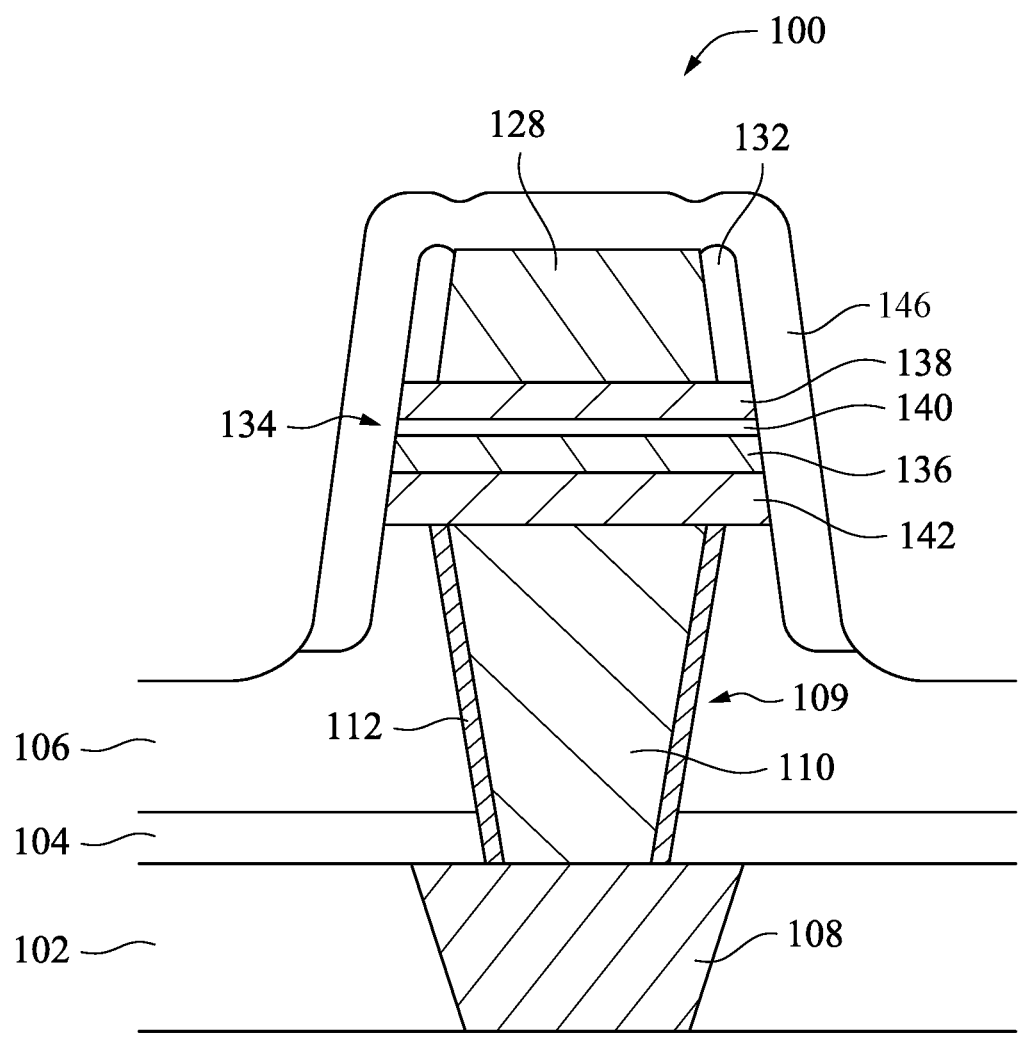

FIG. 7 is a cross section of a portion of the integrated circuit die 100 during an intermediate stage of processing, according to one embodiment. In FIG. 7, the hard mask 126 has been removed. Removal of the hard mask 126 also causes removal of those portions of the first sidewall spacer 132 that were positioned on sidewalls of the hard mask 126.

A second sidewall spacer layer 146 has been deposited on top electrode of 128, on the first sidewall spacers 132, on sidewalls of the magnetic tunnel junction 134, and on the dielectric layer 106. The second sidewall spacer layer 146 can include SiN. The second sidewall spacer layer 146 is between 200 Å and 300 Å in thickness. Other suitable materials and thicknesses can be used for the second sidewall spacer layer 146 without departing from the scope of the present disclosure. The second sidewall spacer layer 146 can be deposited by chemical vapor deposition, physical vapor deposition, or atomic layer deposition.

Figure 8:
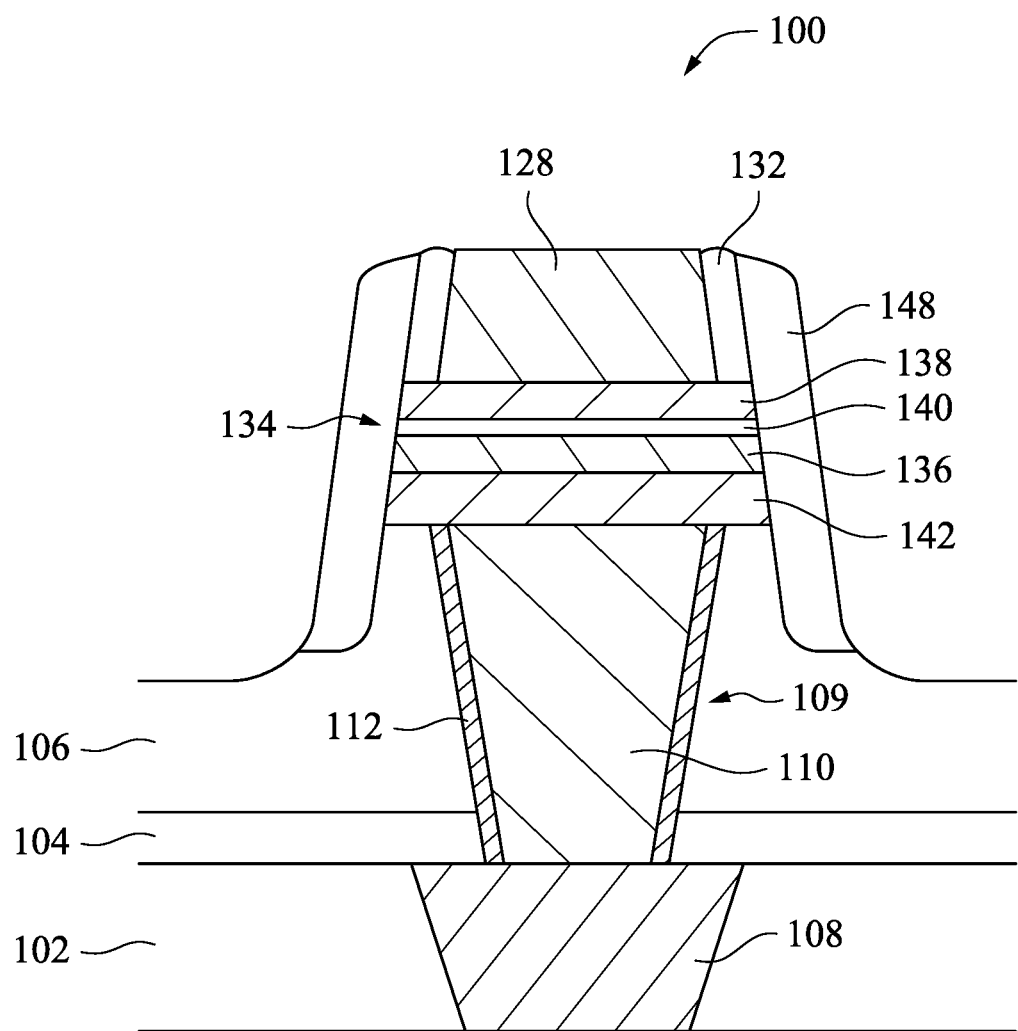

FIG. 8 is a cross section of a portion of the integrated circuit die 100 during an intermediate stage of processing, according to one embodiment. In FIG. 8, a second sidewall spacer 148 is formed from the second sidewall spacer layer 146. The second sidewall spacer 148 is formed by etching the second sidewall spacer layer 146. The etching process removes the second sidewall spacer layer 146 from the dielectric layer 106, from the top of the top electrode 128, and from the top of the first sidewall spacer 132.

In one embodiment, the top electrode 128 is formed by using an anisotropic etching process. The anisotropic etching process selectively etches in the downward direction. The result is that the second sidewall spacer layer 146 is completely removed from horizontal surfaces where its thickness is smaller. The second sidewall spacer layer 146 is not completely removed from the sidewalls of the magnetic tunnel junction 134 and the lateral surfaces of the first sidewall spacer 132 because the vertical thickness of the second sidewall spacer layer 146 is much thicker at that location.

The etching process can include a timed etch. The etchant will etch vertically at a particular rate. The duration of the etch is selected so that the second sidewall spacer layer 146 is completely removed from the horizontal surfaces where its thickness is smallest. The duration of the etch is selected so that the second sidewall spacer layer 146 is not completely removed from the sidewalls of the magnetic tunnel junction 134 and the hard mask 126 where the vertical thickness is much greater.

Figure 9:
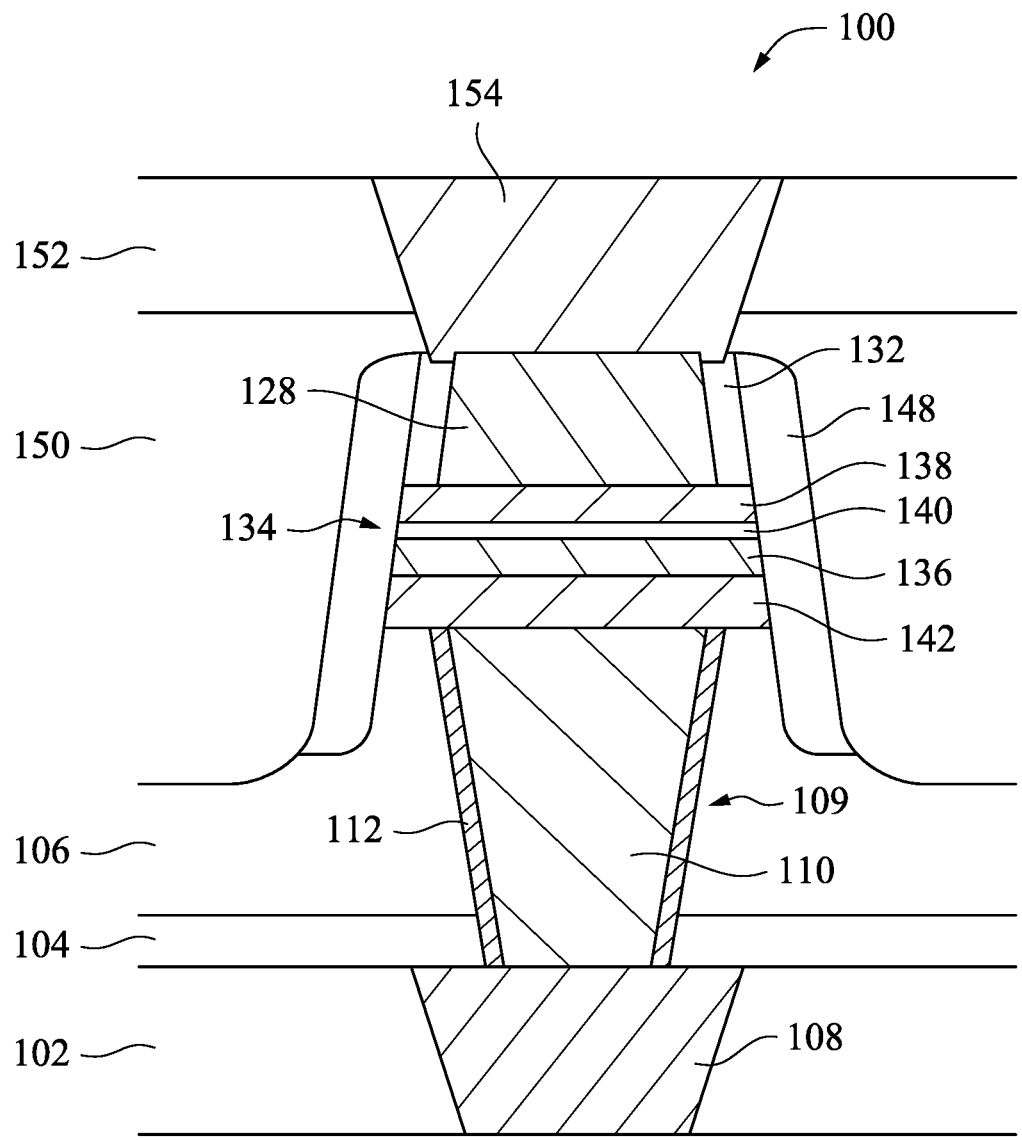

FIG. 9 is a cross-section of a portion of the integrated circuit die 100 during an intermediate stage of processing, according to one embodiment. In FIG. 9, a dielectric layer 150 is deposited in the recesses 144 in the dielectric layer 106 and on the second sidewall spacer 148. The dielectric layer 152 is deposited on the dielectric layer 150. A metal interconnect 154 is deposited in a trench in the dielectric layers 150 and 152. The metal interconnect is in contact with the top electrode 128.

The dielectric layer 150 can include SiO$_2$ with a thickness that fills the recesses 144 between about 50 Å and 150 Å past the top surface of the top electrode 128. Other suitable materials and thicknesses can be used for the dielectric layer 150 without departing from the scope of the present disclosure. The dielectric layer 152 can be a low-k dielectric layer having the same materials and properties as the dielectric layer 102.

The metal interconnect 154 can be a metal line similar to the metal line 108. Alternatively, the metal interconnect 154 can be a plug or other type of interconnect that connects the top electrode 128 to a metal line or other signal path.

FIGS. 1-9 illustrate a process performing a MRAM cell including a magnetic tunnel junction 134. For simplicity, a single MRAM cell is shown in FIGS. 1-9. However, the process shown in FIGS. 1-9 forms an array of MRAM cells in the integrated circuit die 100. Each memory cell includes a magnetic tunnel junction 134 as shown in FIG. 9. The array of MRAM cells can be arranged in rows and columns and connected by wordlines and bitlines. The wordlines and bitlines can be connected to access transistors formed in conjunction with a semiconductor substrate in layers below the layers and structure shown in FIGS. 1-9. The wordlines, bitlines, and access transistors can be utilized to write data to the magnetic tunnel junctions 134 and to read data from the magnetic tunnel junctions 134.

In one embodiment, the magnetic tunnel junction 134, the top electrode 128, and the bottom electrode 142 are substantially circular when viewed from above. Accordingly, a top view of the first sidewall spacer 132 will show the first sidewall spacer 132 encircling the top electrode 128 positioned on a sidewall of the top electrode 128. Likewise, the multi-junction tunnel sidewall spacer 148 laterally encircles the magnetic tunnel junction 134 and the first sidewall spacer 132.

Figure 10:
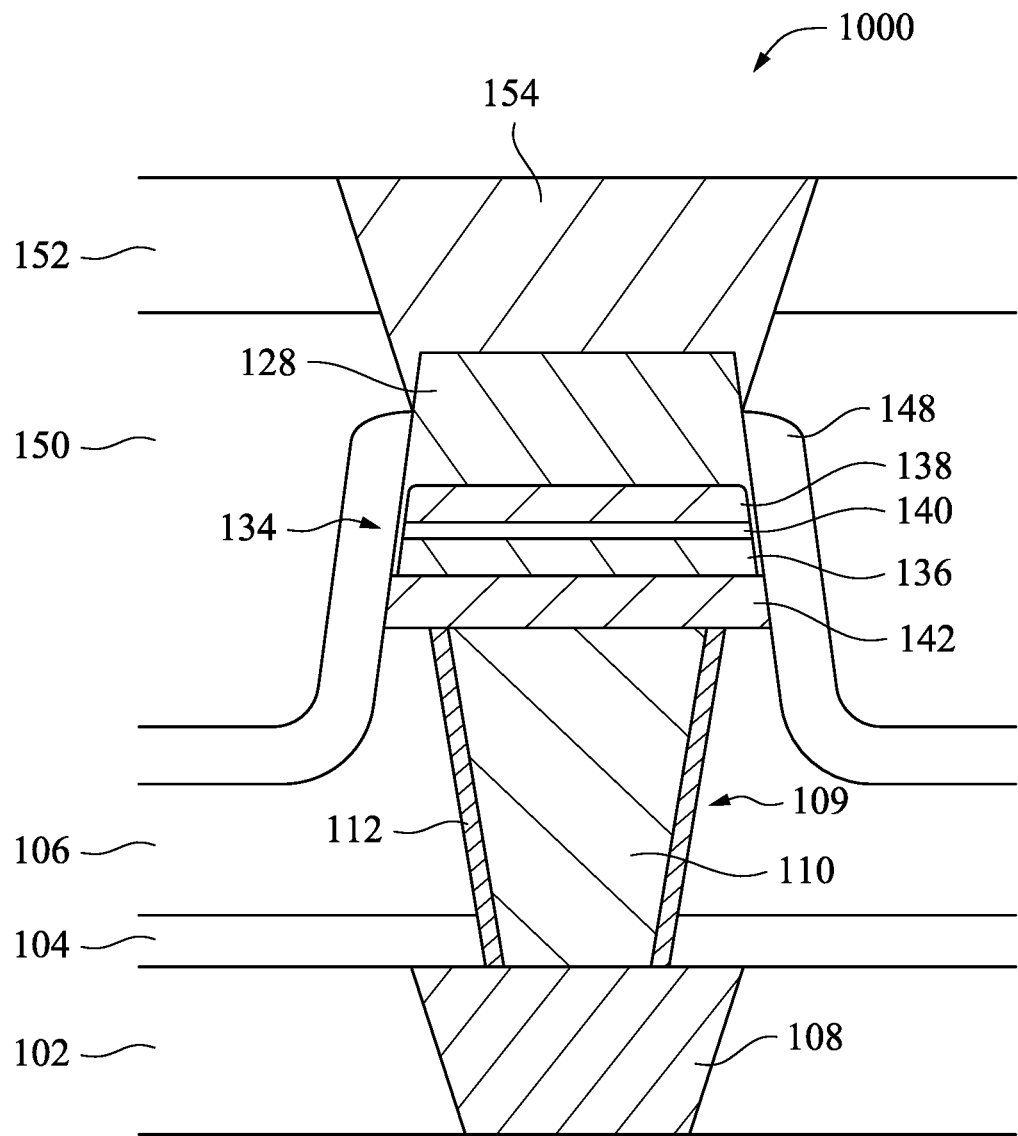
FIG. 10 is a cross-section of an integrated circuit die.

FIG. 10 is a cross-section of an integrated circuit die 1000 that was not formed using the advantageous first sidewall spacer 132 illustrated in FIGS. 5-9. The integrated circuit die includes many of the same structures and layers as those shown in FIG. 9. However, as can be seen in FIG. 10, some material from the top electrode 128 has been deposited on the sidewalls of the magnetic tunnel junction 134. This can result in a short circuit at the magnetic tunnel junction 134 during operation of the integrated circuit die 1000.

This problem is a result of using the same hard mask 126 to pattern the top electrode 128, the magnetic tunnel junction 134, and the bottom electrode 142. In the integrated circuit die 1000, the top electrode 128, the magnetic tunnel junction 134, and the bottom electrode 142 are patterned in a single ion beam etching process. The ion beam bombardment results in some material etched from the top electrode 128 being redeposited on sidewalls of the magnetic tunnel junction. This results in the short circuit situation shown in FIG. 10.

The integrated circuit die 100 of FIGS. 1-9 does not have this problem because the top electrode 128 is first patterned and a first sidewall spacer 132 is formed around the top electrode 128. The magnetic tunnel junction 134 is then patterned with an ion beam etching process. The first sidewall spacer 132 prevents any material from the top electrode 128 being redeposited on the sidewalls of the magnetic tunnel junction 134.

The first sidewall spacer 132 of the integrated circuit die 100 provides an additional benefit. The first sidewall spacer 132 allows for a larger intermetal via or window to be formed in the dielectric layers 150, 152 when forming the metal interconnect 154 to contact the top electrode 128. In the absence of the first sidewall spacer 132, it is possible that the via or window for the metal interconnect 154 will punch through and degrade the electrical properties of the magnetic tunnel junction 134. Accordingly, stricter photolithography requirements will need to be met for the integrated circuit 1000 in order to prevent punch through as described.

Figure 11:
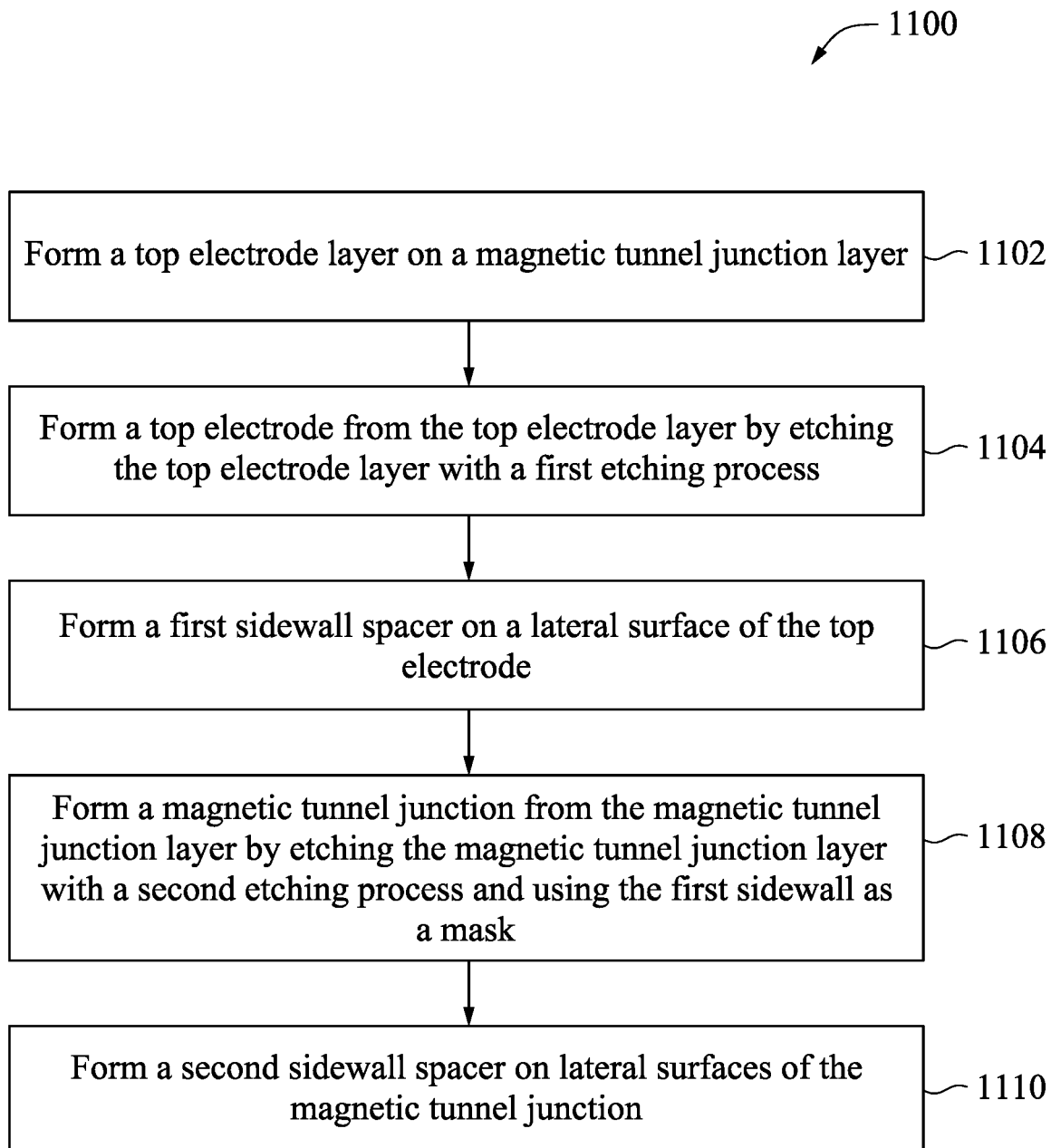
FIG. 11 is a method for fabricating an integrated circuit die, according to an embodiment.

FIG. 11 is a method 1100 for fabricating an integrated circuit die, according to an embodiment. At 1102, the method 1100 includes forming a top electrode layer on a magnetic tunnel junction layer. One example of a top electrode layer is the top electrode layer 124 of FIG. 2. At 1104, the method 1100 includes forming a top electrode from the top electrode layer by etching the top electrode layer with a first etching process. One example of a top electrode is the top electrode 128 of FIG. 3. At 1106, the method 1100 includes forming a first sidewall spacer on a lateral surface of the top electrode. One example of a first sidewall spacer is the first sidewall spacer 132 of FIG. 5. At 1108, the method 1100 includes forming a magnetic tunnel junction from the magnetic tunnel junction layer by etching the magnetic tunnel junction layer with a second etching process and using the first sidewall as a mask. One example of a magnetic tunnel junction layer is the magnetic tunnel junction layer 134 of FIG. 6. At 1110, the method 1100 includes forming a second sidewall spacer on lateral surfaces of the magnetic tunnel junction. One example of a second sidewall spacer is the second sidewall spacer 148 of FIG. 8. While the method 1100 has been described, in part, with examples from FIGS. 2, 3, 5, 6, and 8. The method 1100 can be suitable for forming an integrated circuit die 100 other than shown in the aforementioned Figures without departing from the scope of the present disclosure.

In one embodiment, an integrated circuit die includes a magnetic tunnel junction, a top electrode positioned on a top of the magnetic tunnel junction, and a first sidewall spacer positioned on a lateral surface of the top electrode. The integrated circuit die includes a second sidewall spacer positioned on a lateral surface of the magnetic tunnel junction.

In one embodiment, an integrated circuit die includes a magnetic tunnel junction. The magnetic tunnel junction includes a bottom magnetic plate, a top magnetic plate, and a barrier between the top magnetic plate and the bottom magnetic plate. The integrated circuit die includes a top electrode positioned on the top magnetic plate, a first sidewall spacer positioned on the top magnetic plate and on a sidewall of the top electrode, and a second sidewall spacer positioned on lateral surfaces of the bottom magnetic plate, the top magnetic plate, and the barrier.

The various embodiments described above can be combined to provide further embodiments. All U.S. patent application publications and U.S. patent applications referred to in this specification and/or listed in the Application Data Sheet are incorporated herein by reference, in their entirety. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A structure, comprising:
a semiconductor substrate;
a first structure over the semiconductor substrate;
a first electrode directly and completely on a first surface of the first structure; and
a first sidewall spacer on the first surface of the first structure and laterally adjacent to a sidewall of the first electrode.

2. The structure of claim 1, wherein an outer surface of the first sidewall spacer is continuous with a sidewall of the first structure.

3. The structure of claim 1, comprising a contact structure in vertical contact with the first electrode and in lateral contact with the first sidewall spacer.

4. The structure of claim 1, comprising a second electrode on a second surface of the first structure, the second surface opposite to the first surface of the first structure.

5. The structure of claim 4, comprising a second sidewall spacer laterally adjacent to a sidewall of the first structure and laterally adjacent to the first sidewall spacer, wherein the second sidewall spacer extends vertically beyond both the first surface and the second surface of the first structure.

6. The structure of claim 1, comprising a dielectric layer below the second electrode, wherein the second sidewall spacer is laterally adjacent to the dielectric layer.

7. A method comprising:
forming a first electrode layer on a first layer;
forming a metal interconnect on the first electrode;
after the forming the metal interconnect, forming a first spacer layer laterally adjacent to the first electrode; and
forming a first structure by etching the first layer with an ion beam etching process and using the first spacer layer as a mask.

8. The method of claim 7, wherein the etching the first layer includes etching the first layer with ions bombarding the first layer at an angle between 20 degree and 50 degree, inclusive.

9. The method of claim 7, wherein the etching the first layer includes etching the first layer with ions impacting the first layer with a substantially downward trajectory.

10. The method of claim 7, comprising forming a second spacer layer laterally adjacent to the first spacer layer.

11. The method of claim 7, wherein the first spacer layer includes one or more of silicon nitride, aluminum oxide, or titanium nitride.

12. The method of claim 10, wherein the second spacer layer includes a same material as the first spacer layer.

13. The method of claim 10, wherein the second spacer layer includes a dielectric material and the first spacer layer includes a conductive material.

14. A structure comprising:
a semiconductor substrate;
a magnetic tunnel junction structure over the semiconductor substrate and including:
a bottom magnetic plate;
a top magnetic plate; and
a barrier between the top magnetic plate and the bottom magnetic plate;
a top electrode positioned on the top magnetic plate; and
a first sidewall spacer positioned on the top magnetic plate and on a sidewall of the top electrode.

15. The structure of claim 14, further comprising a metal interconnect in contact with a top surface of the top electrode and laterally in contact with the first sidewall spacer.

16. The structure of claim 14, wherein an outer surface of the first sidewall spacer is continuous with a sidewall of the magnetic tunnel junction structure.

17. The structure of claim 14, comprising a second sidewall spacer laterally adjacent to the first sidewall spacer.

18. The structure of claim 17, comprising a dielectric layer between the magnetic tunnel junction structure and the semiconductor substrate, wherein the second sidewall spacer is laterally adjacent to the dielectric layer.

19. The structure of claim 18, wherein the second sidewall spacer is also vertically adjacent to the dielectric layer.

20. The structure of claim 14, wherein the top electrode is positioned directly and completely on the top magnetic plate.

* * * * *